United States Patent [19]

Sher et al.

[11] Patent Number: 5,668,751
[45] Date of Patent: Sep. 16, 1997

[54] ANTIFUSE PROGRAMMING METHOD AND APPARATUS

[75] Inventors: Joseph C. Sher; Brent Keeth, both of Boise, Id.

[73] Assignee: Micron Technology, Inc., Boise, Id.

[21] Appl. No.: 690,777

[22] Filed: Aug. 1, 1996

[51] Int. Cl.[6] .............. G11C 17/00; G11C 7/00
[52] U.S. Cl. .............. 365/96; 365/225.7; 365/189.07; 327/525
[58] Field of Search .............. 365/225.7, 96, 365/94, 189.07; 327/525

[56] References Cited

U.S. PATENT DOCUMENTS

| | | | |
|---|---|---|---|
| 5,008,855 | 4/1991 | Eltoukhy et al. | 365/96 |
| 5,250,459 | 10/1993 | Lee | 437/52 |
| 5,257,222 | 10/1993 | Lee | 365/96 |
| 5,282,158 | 1/1994 | Lee | 365/96 |
| 5,301,159 | 4/1994 | Lee | 365/225.7 |
| 5,324,681 | 6/1994 | Lowrey et al. | 437/52 |
| 5,331,196 | 7/1994 | Lowrey et al. | 257/529 |
| 5,371,414 | 12/1994 | Galbraith | 327/525 |
| 5,448,187 | 9/1995 | Kowalski | 365/225.7 |
| 5,495,436 | 2/1996 | Callahan | 365/225.7 X |

*Primary Examiner*—David C. Nelms
*Assistant Examiner*—Huan Hoang
*Attorney, Agent, or Firm*—Schwegman, Lundberg, Woessner & Kluth, P.A.

[57] ABSTRACT

A self-timing antifuse programming controller optimizes programming of one or many antifuses. A programming current through the antifuse is monitored until it reaches a current trip point, thereby initiating a delay period. The delay period is determined by charging a capacitor with a scaled replicate of the antifuse current until a trip point voltage is reached. Antifuses which are more resistive receive a longer programming time. The current trip point and delay period are independently programmable. The antifuse programming controller also flags completion of antifuse programming allowing expeditious programming of further antifuses in an array of antifuses to minimize overall programming time.

24 Claims, 2 Drawing Sheets

ANTIFUSE PROGRAMMING METHOD AND APPARATUS

THE FIELD OF THE INVENTION

This invention relates to integrated circuits and more particularly to methods and apparatus for programming an antifuse element.

BACKGROUND OF THE INVENTION

Integrated circuits (ICs) often require selective one time programmable (OTP) permanent electrical connections between circuit nodes. Such a connection can be implemented by an antifuse. Antifuses are often used to permanently store binary data on an IC. Binary logic states are represented by "on" and "off" states of the antifuse. Antifuses are used in numerous memory storage applications including programmable logic arrays (PALs), programmable logic devices, and programmable read only memories (PROMs). Antifuses are also often used in memory cell arrays such as dynamic random access memories (DRAMs). After testing the DRAM for failing memory cells, failing cell addresses in the DRAM are remapped to functional cell addresses by selective permanent programming of antifuse elements.

Antifuses are fabricated with structure similar to that of a capacitor; two conductive electrical terminals are separated by a dielectric layer. An unprogrammed "off" state, in which the antifuse is fabricated, presents a high resistance between the antifuse terminals. The antifuse can also be programmed to an "on" state in which a low resistance connection between the antifuse terminals is desired. To program an antifuse "on," a large programming voltage is applied across the antifuse terminals, breaking down the interposed dielectric and forming a conductive link between the antifuse terminals.

For a programmed antifuse in the "on" state, a low resistance conductive link between the antifuse terminals is desired in order to minimize access time in reading the state of the antifuse. A characteristic RC time constant is formed by the resistance of the antifuse and the input capacitance of antifuse detection circuitry. By minimizing the resistance of the antifuse when programmed "on", access time for reading the state of the antifuse is reduced. A low "on" state resistance also obtains a better noise margin for properly detecting the state of the antifuse. In addition, lower initial resistance ensures stable and robust reading of the antifuse in spite of a gradual increase in resistance over time due to continued oxidation of the antifuse.

However, the conductive link between the antifuse terminals is sometimes only marginally conductive due to, for example, variations in dielectric thickness between antifuses. Such variations in dielectric thickness between antifuses may occur on the same integrated circuit, on different integrated circuits produced by the same fabrication process, or on different integrated circuits produced by different fabrications processes. Marginally conductive antifuses typically have resistances which are not well controlled, increasing the difficulty in accurately reading the state of the antifuse by detection circuitry.

For marginally conductive antifuses, it is desirable to apply the large programming voltage for a longer period of time or to apply multiple programming pulses in order to further reduce the resistance across the antifuse and thereby avoid only marginally programming an antifuse into its "on" state. One example of using multiple programming pulses to lower the resistance of a programmed antifuse is found in U.S. Pat. No. 5,257,222, which issued on Oct. 26, 1993 entitled "ANTIFUSE PROGRAMMING BY TRANSISTOR SNAP-BACK", which is assigned to the assignee of the present invention.

It is also desirable to restrict use of extended programming voltages only to marginally programmed antifuses, since an adequately programmed antifuse draws a large current. Such large currents through the adequately programmed antifuse may degrade the antifuse dielectric or create electromigration damage to associated metal interconnections. There is a need to reduce the resistance across a programmed antifuse without degrading the antifuse dielectric or creating damage to metal interconnections.

SUMMARY OF THE INVENTION

A programming circuit for an antifuse comprises a current monitor for monitoring current through the antifuse, a comparison circuit for comparing the monitored current to a selected level of current or current trip point, a switch for interrupting the current through the antifuse, and a delay circuit for turning off the switch to interrupt the current through the antifuse.

A programming voltage is applied across the antifuse, and a resulting current through the antifuse is monitored. After the antifuse current reaches the selected current which corresponds to the antifuse being programmed, a delay period is initiated. After the delay period, current through the antifuse is interrupted, and programming of the antifuse is complete. The delay period is a function of the current through the programmed antifuse. More resistive antifuses are programmed for a longer delay period after the current trip point is reached. The selected current or current trip point, and the delay period are independently adjustable.

By programming the antifuse until a current trip point is reached, a known antifuse conductance is obtained at the beginning of the delay period. Since the delay period is a function of the antifuse conductance, damage to the antifuse and metal interconnects is minimized by controlling the length of the delay period of programming. Programming time is optimized for individual antifuse elements, and a tighter distribution of programmed antifuse resistances is obtained. The invention also provides a flag signal for control circuits on the same integrated circuit as well as external test equipment when the antifuse has been optimally programmed. These other circuits may use the flag signal to allocate only the optimal programming time for each individual antifuse element, such that programming of an array of such antifuse elements is similarly optimized.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims and their equivalents.

Circuit Structure

Figure 1:
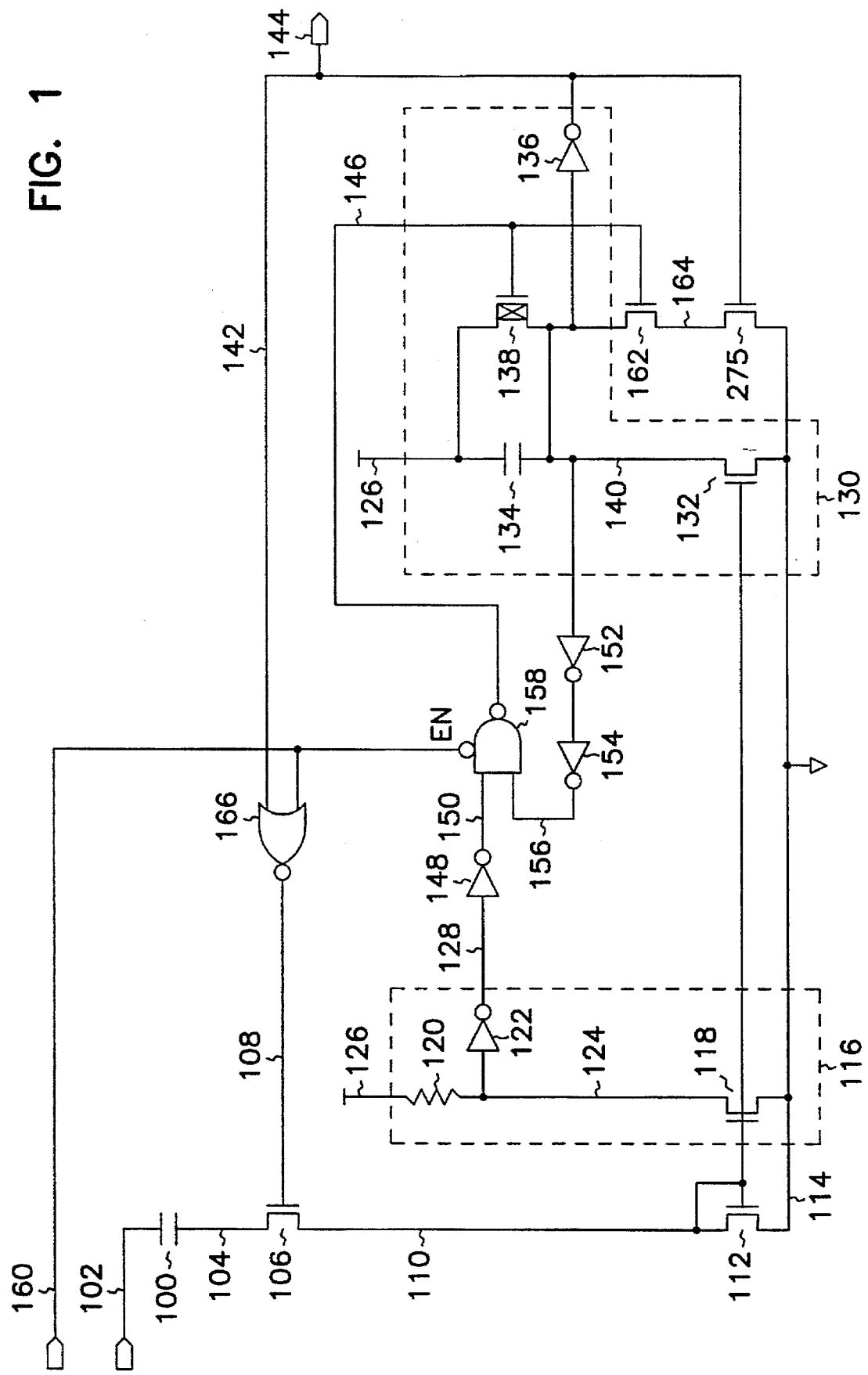
FIG. 1 is a schematic diagram illustrating an antifuse programming controller.
Figure 2A:
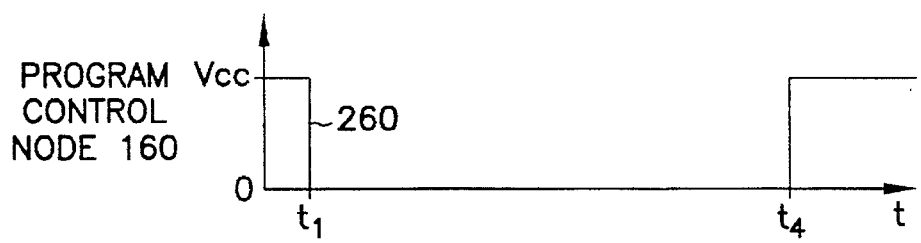
FIGS. 2A–2E are timing diagrams of voltages at selected nodes during programming of the antifuse programming controller of FIG. 1.
Figure 2B:
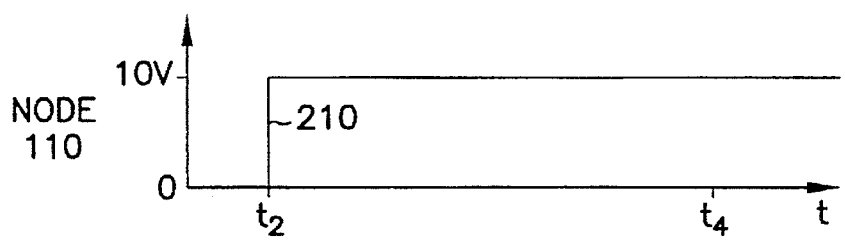
Figure 2C:
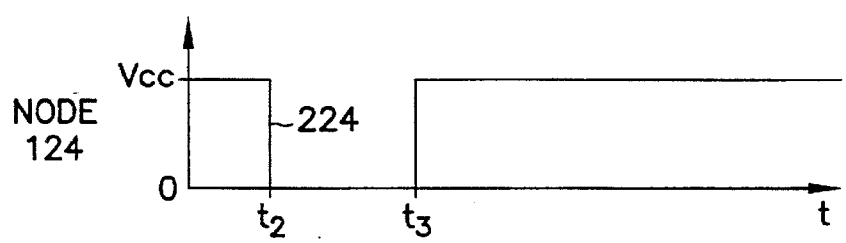
Figure 2D:
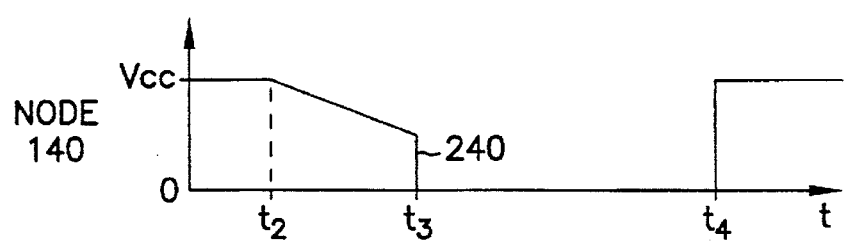
Figure 2E:
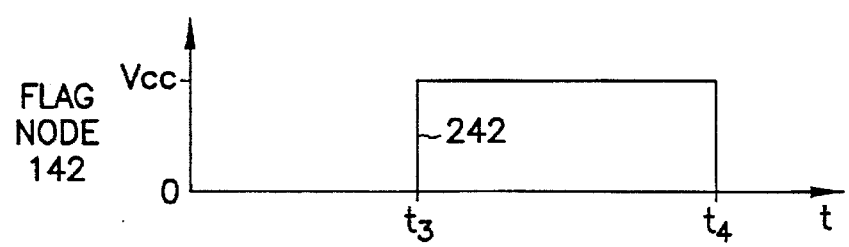

The present invention differentiates between marginally and adequately programmed antifuse elements and alters programming parameters accordingly. FIG. 1 is a schematic diagram illustrating a self-timed two phase antifuse programming controller operating on an antifuse 100 having a first and second terminal. The first terminal of antifuse 100 is coupled to node 102 and receives a programming voltage at node 102. The second terminal of antifuse 100 is coupled at node 104 to a switch 106 for interrupting a current through the antifuse 100. Switch 106 is an n-channel metal-oxide-semiconductor (NMOS) field effect transistor (FET) having a drain terminal, a gate terminal, and a source terminal. The drain terminal of switch 106 is coupled to the second terminal of antifuse 100 at node 104. The gate terminal of switch 106 receives a shutoff control voltage at node 108. The source terminal of switch 106 is coupled at node 110 to a diode-connected NMOS current monitor FET 112 for monitoring the current through antifuse 100. A drain terminal and a gate terminal of current monitor FET 112 are each coupled to node 110. A source terminal of NMOS current monitor FET 112 is coupled to ground node 114.

The antifuse programming controller of FIG. 1 also comprises a first detector such as comparison circuit 116 for comparing the monitored current to a selected level of current such as a current trip point. In one embodiment, comparison circuit 116 comprises an NMOS first current mirror FET 118, a resistor 120, and a first comparator 122 which is more specifically an inverter.

First current mirror FET 118 replicates the current in current monitor FET 112 and scales this current by a first current mirroring ratio to provide a signal representative of the programming current flowing through the antifuse 100. In one embodiment, the first current mirroring ratio is programmable, for example by switching in FETs in parallel with first current mirror FET 118, such that a current trip point is adjusted. A gate terminal of first current mirror FET 118 is coupled at node 110 to each of the gate and drain terminals of current monitor FET 112. A source terminal of first current mirror FET 118 is coupled to ground node 114. A drain terminal of first current mirror FET 118 is coupled at node 124 to resistor 120. Resistor 120 receives the current replicated and sealed by first current mirror FET 118 and converts this current to a voltage at node 124.

Resistor 120 is coupled between a bias voltage, more particularly a power supply voltage at node 126, and the drain terminal of first current mirror FET 118. In one embodiment, resistor 120 is implemented as an integrated circuit resistor, such as a polysilicon resistor, a source/drain diffusion resistor, a well diffusion resistor, or a thin film resistor. In another embodiment, resistor 120 is implemented as an active device such as a FET. In one embodiment, resistor 120 is made either trimmable or programmable to adjust the current trip point.

First comparator 122 is an inverter, although other known voltage comparator topologies could also be used. First comparator 122 has a first comparator input terminal coupled to node 124 where it receives the voltage derived by resistor 120 from the current replicated by first current mirror FET 118. First comparator 122 provides an output voltage at a first comparator output terminal at node 128 in response to the voltage at node 124 compared to an input voltage trip point of first comparator 122.

The antifuse programming controller of FIG. 1 also comprises a second detector such as delay circuit 130 for turning off switch 106 to interrupt the current through antifuse 100 after adequate programming. Delay circuit 130 comprises a second current mirror FET 132, a capacitor 134, a second comparator 136, and a shorting switch 138. Second current mirror FET 132 replicates the current in current monitor FET 112, and scales this current by a second current mirroring ratio to provide a signal representative of the programming current flowing through the antifuse 100. In one embodiment, the second current mirroring ratio is adjustable, for example by switching in FETs in parallel with second current mirror FET 132. A gate terminal of second current mirror FET 132 is coupled at node 110 to each of the gate and drain terminals of current monitor FET 112. A source terminal of second current mirror FET 132 is coupled to Found node 114. A drain terminal of second current mirror FET 132 is coupled at node 140 to a first capacitor terminal of capacitor 134, which receives and integrates the current replicated and scaled by second current mirror FET 132, thereby producing a resulting voltage at node 140. A second capacitor terminal of capacitor 134 is coupled at node 126 to the power supply voltage.

Second comparator 136 is an inverter, although other known voltage comparator topologies could also be used. Second comparator 136 has a second comparator input terminal coupled to and receiving the voltage at node 140 resulting from the integration by capacitor 134 of the current replicated by second current mirror FET 132. Second comparator 136 provides a binary logic output voltage at a flag node 142 based upon a comparison of the voltage at node 140 to an input voltage trip point of second comparator 136.

Shorting switch 138 is a p-channel metal-oxide-semiconductor (PMOS) FET having a source terminal coupled at node 126 to the second capacitor terminal, a drain terminal coupled at node 140 to the first capacitor terminal, and a gate terminal receiving a shorting control signal at node 146. Shorting switch 138 is initially "on" during the time period when the antifuse 100 is not being programmed such that capacitor 134 is approximately discharged and the voltage at node 140 is approximately equal to the power supply voltage at node 126.

The antifuse programming controller of FIG. 1 also comprises logic circuits for turning on switch 106 until the current through antifuse 100 reaches a current trip point representing adequate programming of the antifuse 100. These logic circuits then initiate the delay period and turn off switch 106 after the delay period. The fast comparator output terminal at node 128 is coupled by inverter 148 at node 150 to a first input terminal of 2-input NAND gate 158. Inverters 152 and 154 couple the first capacitor terminal at node 140 to a second input terminal of NAND gate 158 at node 156. An output terminal of NAND gate 158 provides the shorting control signal at node 146. NAND gate 158 also has an enable input, referred to as EN, at program control node 160. When EN receives a low binary logic value (low), the NAND function of NAND gate 158 is enabled. When EN receives a high binary logic value (high), the NAND function of NAND gate 158 is disabled, and the shorting control signal at node 146 is pulled low.

The shorting control signal at node 146 is also provided to a gate terminal of NMOS FET 162, which has a drain terminal coupled to the first capacitor terminal at node 140 and a source terminal coupled at node 164 to a drain terminal of FET 275. FET 275 has a source terminal coupled to ground node 114 and a gate terminal coupled at flag node 142 to an output terminal of second comparator 136. The output terminal of second comparator 136 is also coupled at flag node 142 to a first input of 2-input NOR gate 166. The second input of NOR gate 166 is coupled to program control node 160. The output of NOR gate 166 provides the shutoff control voltage at node 108. It is understood that other logic circuits could be substituted in FIG. 1 without departing from the scope and spirit of the present invention. Note also that flag node 142 provides the output signal of the second comparator 136 to other circuitry as illustrated by an output connection 144. The other circuitry may also provide control of program control node 160 to control programming current.

Circuit Function

FIGS. 2A, 2B, 2C, 2D and 2E are timing diagrams illustrating time varying voltages at nodes 160, 110, 124, 140 and 142 respectively of the antifuse programming controller of FIG. 1 during programming of antifuse 100. Signal 260 illustrates the voltage at program control node 160. Signals 210, 224, and 240 illustrate the voltage at nodes 110, 124, and 140 respectively. Signal 242 illustrates the voltage at flag node 142.

Before programming antifuse 100, the antifuse programming controller of FIG. 1 is placed in a known initial state, illustrated at time zero in FIGS. 2A–E. In this known initial state, antifuse 100 provides a high resistance between its first terminal at node 102 and its second terminal at node 104. The shutoff control voltage at node 108 is low, thus switch 106 is off. Program control node 160 is high, disabling NAND gate 158, forcing the shorting control signal at node 146 low, and turning on shorting switch 138. Capacitor 134 is approximately discharged through shorting switch 138. FET 162 is off and flag node 142 is low.

To program antifuse 100, program control node 160 is transitioned from high to low at time $t_1$. A programming voltage of approximately 10 volts is applied to node 102 at time $t_2$. The voltage transition of program control node 160 at time $t_1$ turns on switch 106 and enables NAND gate 158. The shorting control signal at the output of NAND gate 158 at node 146 remains low because nodes 124 and 140 are pulled high by resistor 120 and shorting switch 138 respectively. After switch 106 turns on at time $t_1$ and the programming voltage is applied at $t_2$, the voltage across the first and second terminals of antifuse 100 is approximately equal to the difference between the programming voltage (approximately 10 volts) and a voltage slightly more positive than a FET threshold voltage (approximately 0.7 volt) of current monitor FET 112. This large voltage induces breakdown of the dielectric of antifuse 100, thereby forming a conductive link between the first and second terminals of antifuse 100 and allowing current to flow through antifuse 100, switch 106, and current monitor FET 112. Thus, switch 106 allows a programming current to flow through antifuse 100.

The current flowing through current monitor FET 112 is replicated and scaled by first current mirror FET 118 to form a current representative of the current flowing through antifuse 100. Resistor 120 receives the current replicated and scaled by first current mirror FET 118, thereby lowering the voltage at node 124 toward the current trip point corresponding to the input voltage trip point of inverter 122. When sufficient current flows through resistor 120, at approximately time $t_2$, the voltage at node 124 is lowered below the current trip point corresponding to the input voltage trip point of first comparator 122, its output terminal at node 128 transitions from low to high, resulting in a low to high transition of the shorting control signal at node 146, thereby completing initial programming and initiating the delay period at approximately time $t_2$.

Shorting switch 138 turns off upon initiation of the delay period at approximately time $t_2$, and FET 162 turns on. Capacitor 134 begins to charge by integrating a current received from second current mirror FET 132, which replicates and scales the current in current monitor FET 112 to form a current representative of the programming current flowing through antifuse 100. Capacitor 134 lowers the voltage at node 140 as it integrates the current received at node 140 from second current mirror FET 132. Since the current received from second current mirror FET 132 is a function of the current through antifuse 100, the resulting delay period corresponds to an integral of the current through antifuse 100. After this delay period, the voltage across capacitor 134 reaches a predetermined level at time $t_3$, such that the voltage at node 140 is lowered below the input voltage trip point of second comparator 136, causing the logic value at the output terminal of the second comparator 136, at flag node 142, to transition from low to high at approximately time $t_3$. FET 275 turns on, thereby latching the voltage at node 140 such that it is approximately equal to the voltage at ground node 114. The shutoff control voltage at node 108 transitions from high to low and switch 106 turns off, thereby inhibiting programming current from flowing through antifuse 100 and completing the programming of the antifuse 100. In one embodiment, transition of the logic value at flag node 142 from low to high is used to flag control circuits at node 144 that programming of the antifuse 100 is complete, such that the programming current at node 160 may be stopped, and other antifuse 100 elements may be programmed after returning the program control node to a high logic level at time $t_4$. In this way, the self-timing programming controller minimizes the time required to optimally program an array of antifuse 100 elements.

As described above, the current trip point and the delay period are, in one embodiment, independently programmable. This allows increased flexibility to accommodate variations within the same fabrication process, or between different fabrication processes, which affect programming characteristics of the antifuse 100. The current trip point is made adjustable, for example, by switching in FETs in parallel with first current mirror FET 118, thereby adjusting the first current mirroring ratio. In another example, resistor 120 is made either trimmable or programmable to adjust the current trip point. The delay period is made adjustable, for example, by switching in FETs in parallel with second current mirror FET 132, thereby adjusting the second current mirroring ratio. In another example, capacitor 134 value is made programmable to adjust the delay period.

Thus, the present invention provides a convenient method and apparatus for self-timed programming of an antifuse element, featuring monitoring which includes an independently programmable current trip point and delay period. The delay period is a function of programming current through the antifuse 100. A higher resistance of antifuse 100 results in a longer delay period and hence a longer programming time. By monitoring the programming of antifuse 100, and adjusting programming time accordingly, a tighter distribution of programmed antifuse resistances is obtained. This results in an accurate reading of the state of such antifuse 100 elements by detection circuitry. Programming time is optimized for individual antifuse 100 elements, and a flag signal is provided to other circuitry, on the same integrated circuit chip or external testing circuits. These other circuits may use this flag signal to monitor or control programming of an array of antifuse 100 elements, such that overall programming time for the array is reduced.

It should be noted that in CMOS technology, many times certain areas of the semiconductor die described as having a particular doping, could quite easily be of a different doping, promoting a different type of charge carrier. In such instances, if one were to reverse the primary carriers in all areas of the die and adjust for carrier mobility, the invention would operate in the same manner as described herein without departing from the scope and spirit of the present invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of programming an antifuse, the method comprising:
    applying a programming voltage across the antifuse;
    monitoring a resulting current through the antifuse;
    waiting for a delay period after the monitored current reaches a selected level; and
    interrupting the current through the antifuse after the delay period.

2. The method of claim 1, wherein the delay period is a function of the monitored current.

3. The method of claim 1, wherein the delay period is programmable.

4. The method of claim 3, wherein the delay period is programmable by adjusting a first current mirroring ratio of a first current mirror FET to a diode-connected FET.

5. The method of claim 3, wherein the delay period is programmable by adjusting a capacitance value.

6. The method of claim 1, wherein the selected level of current is programmable.

7. The method of claim 6, wherein the selected level of current is programmable by adjusting a second current mirroring ratio of a second current mirror FET to a diode-connected FET.

8. The method of claim 6, wherein the selected level of current is programmable by adjusting a resistance value.

9. The method of claim 1, further comprising flagging completion of programming the antifuse when the current is interrupted.

10. A programming circuit for an antifuse, the programming circuit comprising:
    a current monitor, coupled to the antifuse, that monitors the current through the antifuse;
    a comparison circuit, coupled to the current monitor, that compares the monitored current to a current trip point;
    a switch that interrupts the current through the antifuse; and
    a delay circuit, coupled to the comparison circuit and the switch, that turns off the switch to interrupt the current through the antifuse.

11. The programming circuit of claim 10, wherein the current monitor comprises a diode-connected field-effect transistor (FET) having a gate terminal and a drain terminal, and the gate terminal is coupled to the drain terminal.

12. The programming circuit of claim 10, wherein the comparison circuit comprises:
    a first current mirror FET having a gate terminal and a drain terminal, the gate terminal of the first current mirror FET coupled to the gate and drain terminals of the diode-connected FET;
    a resistor coupling a bias voltage to the drain terminal of the first current mirror FET; and
    a first comparator having a first comparator input terminal coupled to the drain terminal of the first current mirror FET.

13. The programming circuit of claim 12, wherein the bias voltage is a power supply voltage.

14. The programming circuit of claim 12, wherein the first comparator comprises an inverter.

15. The programming circuit of claim 10, wherein the delay circuit comprises:
    a second current mirror FET having a gate terminal and a drain terminal, the gate terminal of the second current mirror FET coupled to the gate and drain terminals of the diode-connected FET;
    a capacitor for receiving a current from the second current mirror FET and integrating the received current to produce a resulting voltage, wherein the capacitor has first and second capacitor terminals, and the first capacitor terminal is coupled to the drain terminal of the second current mirror FET, and the second capacitor terminal receives a bias voltage; and
    a second comparator having second comparator input and output terminals, wherein the second comparator input terminal is coupled to the first capacitor terminal.

16. The programing circuit of claim 15, wherein the delay circuit further comprises a shorting switch coupled to each of the first and second capacitor terminals.

17. The programming circuit of claim 15, wherein the second comparator comprises an inverter.

18. The programming circuit of claim 15, wherein the second comparator flags completion of programming of the antifuse when the capacitor voltage attains a predetermined level.

19. The programming circuit of claim 15, wherein the delay circuit further comprises a latching circuit coupled to the second comparator input and output terminals for latching a voltage at the second comparator input terminal based upon a voltage transition at the second comparator output terminal.

20. A programming circuit for an antifuse, comprising:
    a switch, coupled to the antifuse, that switches a programming current to flow through the antifuse;
    a first detector, coupled to receive a signal representative of the programming current flowing through the antifuse, that detects when the antifuse is initially programmed by the programming current; and
    a second detector, responsive to the fast detector and coupled to receive a signal representative of the programming current flowing through the antifuse, that controls the switch to inhibit programming current from flowing through the antifuse after a predetermined amount of current has flowed through the antifuse following initial programming.

21. The programming circuit of claim 20, wherein the second detector provides an indication of completion of programming of the antifuse upon inhibiting programming current from flowing through the antifuse.

22. A programming circuit for an antifuse, the programming circuit comprising:

a current monitor, coupled to the antifuse, that monitors the current through the antifuse;

a comparison circuit, coupled to the current monitor, that compares the monitored current to a current trip point;

a delay circuit, coupled to the comparison circuit, that provides a signal following a desired delay from the point at which the monitored current is approximately equal to or greater than the current trip point.

23. A method of programming an antifuse, comprising the steps of:

switching a programming current to flow through the antifuse;

detecting when the antifuse is initially programmed by the programming current; and detecting current flow through the antifuse following initial programming; and inhibiting programming current from flowing through the antifuse based on the detected current flow following initial programming of the antifuse.

24. A programming circuit for an antifuse, the programming circuit comprising:

a diode-connected field-effect transistor (FET) having a gate terminal and a drain terminal, wherein the gate terminal is coupled to the drain terminal and to the antifuse, that monitors current through the antifuse;

a first current mirror FET having a gate terminal and a drain terminal, the gate terminal of the first current mirror FET coupled to the gate and drain terminals of the diode-connected FET;

a resistor coupling a bias voltage to the drain terminal of the first current mirror FET;

a first comparator having a first comparator input terminal coupled to the drain terminal of the first current mirror FET that compares the monitored current to a selected level;

a switch that interrupts the current through the antifuse;

a second current mirror FET having a gate terminal and a drain terminal, the gate terminal of the second current mirror FET coupled to the gate and drain terminals of the diode-connected FET;

a capacitor that receives a current from the second current mirror FET and integrates the received current to produce a resulting voltage, wherein the capacitor has first and second capacitor terminals, and the first capacitor terminal is coupled to the drain terminal of the second current mirror FET, and the second capacitor terminal receives a bias voltage; and a second comparator having second comparator input and output terminals, wherein the second comparator input terminal is coupled to the first capacitor terminal and the output terminal provides a signal that causes interruption of current through the antifuse.

* * * * *

UNITED STATES PATENT AND TRADEMARK OFFICE
CERTIFICATE OF CORRECTION

| | | |
|---|---|---|
| PATENT NO. | : | 5,668,751 |
| DATED | : | September 16, 1997 |
| INVENTOR(S) : | | Joseph C. Sher et al. |

It is certified that error appears in the above-identified patent and that said Letters Patent is hereby corrected as shown below:

Col. 8, line 57, please delete "fast" and insert --first--.

Signed and Sealed this

Twenty-fourth Day of March, 1998

Attest:

BRUCE LEHMAN

Attesting Officer      Commissioner of Patents and Trademarks